United States Patent [19]
Strauss

[11] Patent Number: 5,264,723
[45] Date of Patent: Nov. 23, 1993

[54] INTEGRATED CIRCUIT WITH MOS CAPACITOR FOR IMPROVED ESD PROTECTION

[75] Inventor: Mark S. Strauss, Allentown, Pa.

[73] Assignee: AT&T Bell Laboratories, Murray Hill, N.J.

[21] Appl. No.: 865,577

[22] Filed: Apr. 9, 1992

[51] Int. Cl.$^5$ ............................................. H01L 27/02
[52] U.S. Cl. ................................... 257/532; 257/534; 257/535; 257/297
[58] Field of Search ............... 257/532, 534, 535, 297

[56] References Cited

U.S. PATENT DOCUMENTS

| | | | |
|---|---|---|---|
| 4,806,999 | 2/1989 | Strauss | 357/23.13 |
| 4,821,089 | 4/1989 | Strauss | 357/68 |
| 4,990,802 | 2/1991 | Smooha | 307/482.1 |
| 5,032,892 | 7/1991 | Chern et al. | 257/532 |

OTHER PUBLICATIONS

"The Dynamic of Electrostatic Discharge Prior to Bipolar Action Related Snap-Back", by Gadi Krieger, VLSI Tichnology Inc., 1101 McKay Dr., San Jose, Calif. 95131, 1989 EOS/ESD Symposium Proceedings, p. 136 through 144.

Primary Examiner—Edward Wojciechowicz
Attorney, Agent, or Firm—James H. Fox

[57] ABSTRACT

A MOS capacitor, with the polysilicon gate level as one plate, the gate oxide as the insulator, and the underlying semiconductor tub region as the other plate, is used to increase electrostatic discharge (ESD) protection. In an illustrative embodiment, wherein the substrate is n-type and the tub is p-type, the polysilicon level is connected to the negative power supply voltage conductor ($V_{SS}$), and the underlying semiconductor region is connected to the positive power supply conductor ($V_{DD}$). Since the tub region is p-type, an accumulation-type capacitor is formed. Surprisingly, the thin gate oxide is sufficient to withstand the high ESD voltages, with the protection increasing in one design from less than 1000 volts without the capacitor to 2000 volts with the capacitor.

27 Claims, 1 Drawing Sheet

INTEGRATED CIRCUIT WITH MOS CAPACITOR FOR IMPROVED ESD PROTECTION

BACKGROUND OF THE INVENTION

1. Field of the Invention

The present invention relates to an integrated circuit having improved electrostatic discharge (ESD) protection.

2. Description of the Prior Art

In the design of integrated circuits, the problem of ESD protection has received considerable attention, especially as dimensions shrink below the 1.5 micron level. In addition, the lightly doped drain (LDD) type transistor structure is suspected of reducing the voltage threshold at which ESD failure occurs. An excessively high ESD voltage conducted from a package terminal to the integrated circuit bondpad can easily damage input or output circuitry, unless protection techniques are adopted. Some approaches to improving ESD performance rely on the use of voltage-clamping diodes or transistors. For example, referring to FIG. 1, an input/output bondpad 100 is connected to a package terminal. An output stage (transistors 101, 102) and/or an input stage (transistors 108, 109) are coupled to the bonded. Typically, protection devices 103 and 104 limit the voltage on the bondpad. The input resistor 105 and additional diodes 106, 107 are also optionally provided in some cases, to further protect the input transistors. When the n-channel output transistor 102 is present, experience indicates that it often breaks down at a lower voltage than the protection circuitry, due to its inherent bipolar action through the source/substrate/drain path.

The voltage-clamping techniques are especially desirable to protect the input transistors, where breakdown of the thin gate oxide is a very significant source of failure due to ESD events. Various voltage clamping device structures have been adopted to improve ESD protection; see, for example, U.S. Pat. Nos. 4,806,999 and 4,821,089 co-assigned herewith.

Another approach to ESD protection is to supply a capacitance across the power supply voltage conductors ($V_{DD}$ and $V_{SS}$); see "The Dynamics of Electrostatic Discharge Prior to Bipolar Action Related Snap-Back"; G. Krieger, 1989 EOS/ESD Symposium Proceedings. This is said to provide increased protection by slowing down the increase of the voltage on the input/output bondpad during an ESD event. That is said to provide additional time for the ESD protection circuitry to react, thereby protecting the thin gate oxides that are very susceptible to ESD damage. However, the capacitance relied on for this purpose is the n-well to p-substrate junction capacitance that is formed by the n-well in which p-channel transistors are formed. It is also noted in the Krieger article that the capacitance is charged via a forward biased p+ drain to n-well diode, being diode $D_p$ shown in FIG. 2 of Krieger.

SUMMARY OF THE INVENTION

I have invented an improved integrated circuit ESD protection technique. A MOS capacitor connected across the power supply voltage conductors provides for improved ESD protection. The capacitor operates in the accumulation mode when positive ESD voltages are present.

DETAILED DESCRIPTION

Figure 1:
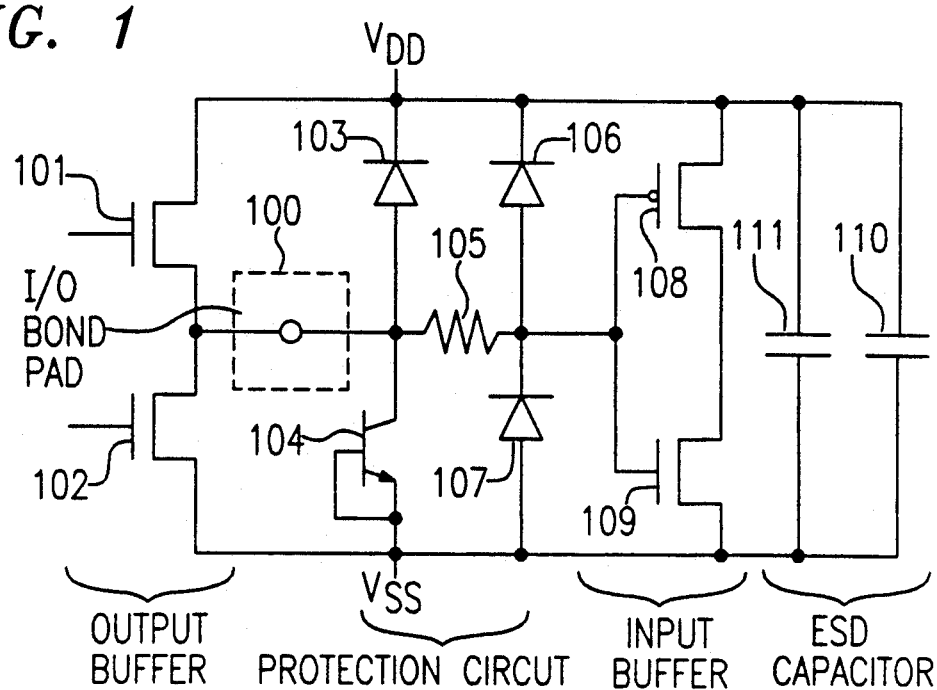
FIG. 1 shows an illustrative embodiment of input/output circuitry protected by the present technique.

The following detailed description relates to an integrated circuit having improved ESD protection. Referring to FIG. 1, an illustrative embodiment of circuitry that implements the present technique is shown, with various other protection circuits being possible. The junction capacitance noted above in the Krieger article is indicated as capacitor 110, and is an inherent part of CMOS integrated circuits formed in tubs. In the present invention, an additional capacitor 111 is included between the positive and negative power supply conductors. I have determined that when constructed according to the technique described below, this additional capacitor is beneficial in increasing the ESD failure threshold voltage, thereby reducing the likelihood of failure due to an ESD event. According to the inventive technique, the additional capacitor 111 is a MOS type formed from an overlying conductor, a dielectric, and an underlying doped semiconductor region.

This type of capacitor operates in the accumulation mode during a positive-voltage ESD event, and is known per se in the integrated circuit art for various small-signal applications. However, I have surprisingly discovered that the use of such a capacitor can significantly increase ESD failure threshold voltages. This capacitor may be formed with the same dielectric as the gates of the MOS transistors formed on the integrated circuit. Surprisingly, this relatively thin capacitor dielectric does not prematurely break down during an ESD event, as might be expected. That is, the capacitor increases the ESD failure threshold, rather than decrease it, as might be expected from the use of an additional device with a thin oxide gate dielectric that is susceptible to ESD breakdown when used as the gate oxide for input transistors.

Figure 2:
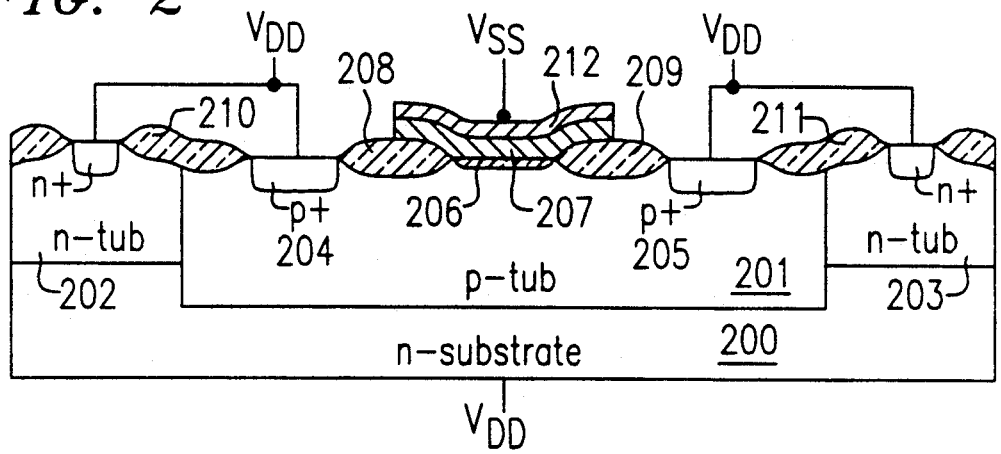
FIG. 2 shows an illustrative embodiment of a MOS capacitor that implements the present invention for n-type semiconductor substrates.

Referring to FIG. 2, an illustrative embodiment of the capacitor 111 is shown in the case wherein the integrated circuit is formed in an n-type substrate region 200. A p-tub region 201 is formed in the n-region 200. This may be accomplished using the so-called twin tub technique, as shown for example in U.S. Pat. No. 4,435,896, co-assigned herewith. In that case, tubs 202, 203 of the opposite conductivity type are formed adjacent to tub 201. However, other tub-forming techniques, including single-tub (also referred to as single-well) processes are possible for use with the present invention. The capacitor according to this embodiment of the inventive technique includes the p-tub region 201 as one plate (the "lower" plate) of the capacitor. This plate is connected to the positive power supply conductor $V_{DD}$ by at least one tub-tie region, with two p+ doped tub-tie regions 204 and 205 being shown in FIG. 2. The capacitor dielectric is formed by dielectric region 206, being typically silicon dioxide that may optionally include other dielectric layers. This capacitor dielectric is typically a gate-level dielectric that is formed by the same process as forms the gate dielectrics of the MOS transistors of the integrated circuit.

The other plate of the capacitor (the "upper" plate) is formed by conductor 207, being typically formed from the same doped polysilicon layer that forms the gate electrodes of the MOS transistors. Note that a silicide layer 212 (e.g., titanium silicide, cobalt silicide, tungsten silicide, molybdenum silicide, tantalum silicide, etc.) may optionally be included as part of this conductor, according to techniques known in the art. However, the use of other conductor levels is possible, including a second (or third) polysilicon conductor level, for example. In that case, the dielectric layer 206 is formed at a different time than the gate dielectric layer. This upper plate is connected to the negative power supply conductor, $V_{SS}$, in this embodiment. The edges of the upper capacitor plate are optionally isolated by field oxide regions 208 and 209 from the adjacent regions tub-tie regions 204 and 205, respectively. This isolation is desirable in the case wherein a silicide layer is formed by the self-aligned silicide ("salicide") process as part of the upper conductor and tub-tie contact. This reduces the likelihood of shorts between this plate and the tub-ties, which would short out the capacitor. The surface region of tub 201 may be spaced from that of the adjacent tubs by field oxide regions 210 and 211 if desired.

Note that in operation, positive charges accumulate immediately under the capacitor dielectric 206, due to the polarity of the voltages applied to the capacitor plates, and the fact that the lower plate is formed in a p-type region. During a positive ESD event, still more positive charges are drawn to this region, and hence the capacitor is referred to as operating in the accumulation mode. This contrasts to the inversion-type MOS capacitor, wherein in operation the surface immediately under the gate oxide inverts to the opposite conductivity as the semiconductor region in which it is formed.

A protective circuit according to FIG. 1, was constructed, including a capacitor 111 constructed according to the above-embodiment, in an integrated circuit formed in 0.9 micron technology. The total capacitor area was $2.23 \times 10^6$ square microns, which comprised a multiplicity of capacitor elements in parallel. The dielectric layer was a gate oxide having a thickness of 15 nanometers (150 angstroms), producing a capacitance of 5.6 nanofarads. The p-tub 201 had a surface doping level of 4 to $5 \times 10^{16}/cm^3$, formed in a substrate 200 having a doping of $5 \times 10^{15}/cm^3$. The conductor 207 included doped polysilicon layer approximately 420 nanometers (4200 angstroms) thick, and including a layer of titanium silicide formed thereon by the salicide process. Accordingly, the tub-tie regions 204 and 205 also had a layer of titanium silicide formed thereon. An ESD test was conducted using the "human body model" that is well-known in the art. It was found that the ESD failure threshold was 2000 volts. By effectively removing the capacitor 111 from the circuit (by disconnecting the upper plate from $V_{SS}$ and connecting it to $V_{DD}$), the ESD failure threshold was found to be 1000 volts. Hence, a significant improvement in ESD failure threshold was obtained by the inventive technique.

It is presently believed that the diode 103 aids in the operation of the inventive technique, by providing a conduction path from the bondpad to the capacitor 111 during a positive ESD event, in a comparable manner as diode $D_p$ of Krieger, noted above. However, in other designs, a suitable conduction path may be provided by other circuit elements, in lieu of, or in addition to, the diode 103. For example, a p-channel output transistor (in lieu of the n-channel transistor 101 shown) may provide this conduction path. This is accomplished via the drain-to-tub junction, with the n-tub being connected to $V_{DD}$, and hence the lower capacitor plate, and the p+ drain being connected to the bondpad. In some cases, the drain is connected to the bondpad through a resistor, typically deposited polysilicon or silicide, as shown in U.S. Pat. No. 4,990,802 co-assigned herewith.

Figure 3:
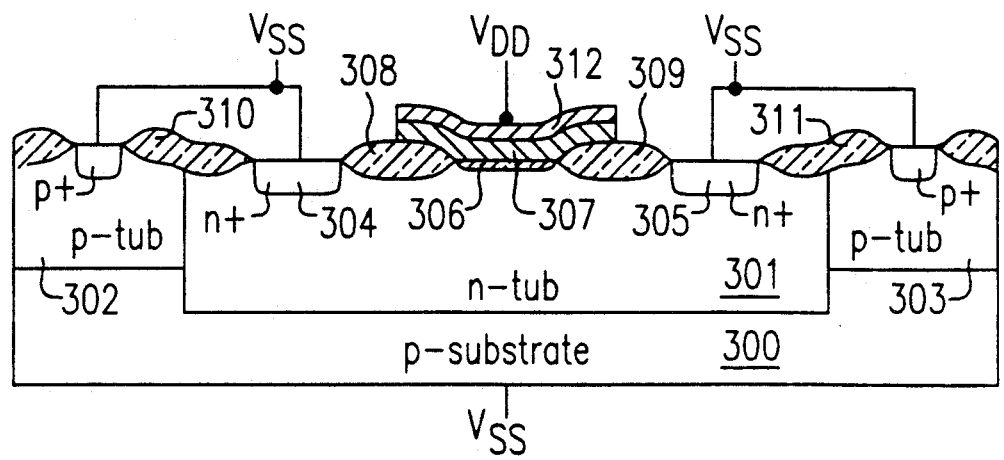
FIG. 3 shows an illustrative embodiment of a MOS capacitor that implements the present invention for p-type semiconductor substrates.

Although the above-embodiment has shown the accumulation-type capacitor formed in a p-tub, it may alternatively be formed in an n-tub, as shown in FIG. 3. In that case, the p-type substrate in which the n-tub is formed is connected to the negative power supply conductor, $V_{SS}$. Also, the upper capacitor plate is then connected to the positive power supply conductor, $V_{DD}$. When operating voltages are present, and when a high positive ESD voltage is present on the bondpad, the negative charges accumulate immediately under the capacitor dielectric region. In either embodiment, I recommend that a protective ESD capacitor according to the inventive technique have a capacitance of at least 100 picofarads. For this purpose, the capacitor dielectric is desirably relatively thin, and I recommend a thickness of less than 25 nanometers (250 angstroms).

I claim:

1. An integrated circuit formed in a semiconductor substrate and including a bondpad coupled to at least one of input or output circuitry, and further including positive and negative power supply voltage conductors, characterized in that said integrated circuit further comprises an accumulation-type capacitor having:
   a first capacitor plate formed in a doped tub region of a first conductivity type formed in said substrate of a second conductivity type, with said first capacitor plate being connected to a first one of said power supply voltage conductors;
   and with said substrate also being connected to said first one of said power supply voltage conductors;
   and a second capacitor plate formed in a deposited conductive layer overlying said doped tub region, and separated therefrom by a dielectric region, with said second capacitor plate connected to a second one of said power supply voltage conductors.

2. The integrated circuit of claim 1 further comprising a conduction device connected between said bondpad and said positive power supply conductor for conducting electrical current resulting from a positive ESD voltage on said bondpad to the capacitor plate connected to said positive power supply voltage conductor.

3. The integrated circuit of claim 2 wherein said conduction device is a diode having a p+ region connected to said bondpad, and an n region connected to said positive power supply conductor.

4. The integrated circuit of claim 2 wherein said conduction device is a p-channel field effect transistor having a p+ drain region connected to said bondpad, and having a n-tub region in which said drain is formed, with said n-tub region being connected to said positive power supply conductor.

5. The integrated circuit of claim 1 wherein said capacitor has a capacitance of at least 100 picofarads.

6. The integrated circuit of claim 1 wherein said dielectric region has a thickness of less than 25 nanometers.

7. The integrated circuit of claim 1 wherein said dielectric region is formed in the same dielectric layer as the gate dielectric in said integrated circuit.

8. The integrated circuit of claim 1 wherein said deposited conductive layer is the same layer as forms gate electrodes in said integrated circuit.

9. The integrated circuit of claim 8 wherein said deposited conductive layer comprises doped polysilicon.

10. The integrated circuit of claim 9 wherein said deposited conductive layer further comprises a metal silicide.

11. The integrated circuit of claim 1 wherein said first conductivity type is p-type, said second conductivity type is n-type, said first one of said power supply voltage conductors is the positive voltage conductor, and said second one of said power supply voltage conductors is the negative voltage conductor; and wherein said substrate is connected to said positive voltage conductor by means of an n+ doped region formed in said substrate.

12. The integrated circuit of claim 1 wherein said first conductivity type is n-type, said second conductivity type is p-type, said first one of said power supply voltage conductors is the negative voltage conductor, and said second one of said power supply voltage conductors is the positive voltage conductor; and wherein said substrate is connected to said negative voltage conductor by means of a p+ doped region formed in said substrate.

13. An integrated circuit formed in a n-type semiconductor substrate and including a bondpad coupled to at least one of input or output circuitry, and further including positive and negative power supply voltage conductors,
    characterized in that said integrated circuit further comprises an accumulation-type capacitor having:
    a first capacitor plate formed in a p-type doped tub region formed in said n-type substrate, with said first capacitor plate being connected to said positive power supply voltage conductor; and with said substrate also being connected to said positive power supply voltage conductor;
    and a second capacitor plate overlying said p-type doped tub region and comprising deposited polysilicon formed in the same layer that forms gate electrodes in said integrated circuit, and with said second capacitor plate being connected to said negative power supply voltage conductor; and
    wherein the capacitor plates are separated by a gate oxide dielectric region.

14. The integrated circuit of claim 13 further comprising a conduction device connected between said bondpad and said positive power supply conductor for conducting electrical current resulting from a positive ESD voltage on said bondpad to said first capacitor plate.

15. The integrated circuit of claim 14 wherein said conduction device is a diode having a p+ region connected to said bondpad, and an n region connected to said positive power supply conductor.

16. The integrated circuit of claim 14 wherein said conduction device is a p-channel field effect transistor having a p+ drain region connected to said bondpad, and having a n-tub region in which said drain is formed, with said n-tub region being connected to said positive power supply conductor.

17. The integrated circuit of claim 13 wherein said capacitor has a capacitance of at least 100 picofarads.

18. The integrated circuit of claim 13 wherein said dielectric region has a thickness of less than 25 nanometers.

19. An integrated circuit formed in a p-type semiconductor substrate and including a bondpad coupled to at least one of input or output circuitry, and further including positive and negative power supply voltage conductors,
    characterized in that said integrated circuit further comprises an accumulation-type capacitor having:
    a first capacitor plate formed in a n-type doped tub region formed in said p-type substrate, with said first capacitor plate being connected to said negative power supply voltage conductor; and with said substrate also being connected to said negative power supply voltage conductor;
    and a second capacitor plate overlying said n-type doped tub region and comprising deposited polysilicon formed in the same layer that forms gate electrodes in said integrated circuit, and with said second capacitor plate being connected to said positive power supply voltage conductor; and
    wherein the capacitor plates are separated by a gate oxide dielectric region.

20. The integrated circuit of claim 19 further comprising a conduction device connected between said bondpad and said positive power supply conductor for conducting electrical current resulting from a positive ESD voltage on said bondpad to said second capacitor plate.

21. The integrated circuit of claim 20 wherein said conduction device is a diode having a p+ region connected to said bondpad, and an n region connected to said positive power supply conductor.

22. The integrated circuit of claim 20 wherein said conduction device is a p-channel field effect transistor having a p+ drain region connected to said bondpad, and having a n-tub region in which said drain is formed, with said n-tub region being connected to said positive power supply conductor.

23. The integrated circuit of claim 19 wherein said capacitor has a capacitance of at least 100 picofarads.

24. The integrated circuit of claim 19 wherein said dielectric region has a thickness of less than 25 nanometers.

25. The integrated circuit of claim 1 further comprising a field oxide isolation region formed on the surface of said doped tub region and surrounding a central portion of said second capacitor plate, and wherein the edge of said second capacitor plate extends over said field oxide isolation region.

26. The integrated circuit of claim 13 further comprising a field oxide isolation region formed on the surface of said doped tub region and surrounding a central portion of said second capacitor plate, and wherein the edge of said second capacitor plate extends over said field oxide isolation region.

27. The integrated circuit of claim 19 further comprising a field oxide isolation region formed on the surface of said doped tub region and surrounding a central portion of said second capacitor plate, and wherein the edge of said second capacitor plate extends over said field oxide isolation region.

* * * * *